(12) United States Patent
Lin

(10) Patent No.: US 7,659,129 B2
(45) Date of Patent: Feb. 9, 2010

(54) FABRICATING METHOD FOR QUANTUM DOT OF ACTIVE LAYER OF LED BY NANO-LITHOGRAPHY

(76) Inventor: Ming-Nung Lin, No. 2, Siamen St., Pingtung City, Pingtung County (TW) 900

( * ) Notice: Subject to any disclaimer, the term of this patent is extended or adjusted under 35 U.S.C. 154(b) by 22 days.

(21) Appl. No.: 12/216,018

(22) Filed: Jun. 27, 2008

(65) Prior Publication Data

US 2009/0087935 A1 Apr. 2, 2009

Related U.S. Application Data

(60) Provisional application No. 60/929,500, filed on Jun. 29, 2007.

(51) Int. Cl.
*H01L 21/20* (2006.01)
(52) U.S. Cl. .................. 438/34; 438/674; 438/962; 977/762; 977/771; 977/774; 257/E21.398; 257/E21.582; 257/E21.09

(58) Field of Classification Search .................. 438/597, 438/674, 962, 34; 977/762, 766, 771, 773, 977/774; 257/E21.04, E21.085, E21.394, 257/E21.398, E21.532, E21.536, E21.575, 257/E21.576, E21.582, E21.09
See application file for complete search history.

(56) References Cited

U.S. PATENT DOCUMENTS

| 2003/0044529 A1* | 3/2003 | Wu et al. .................. 427/240 |
| 2004/0150311 A1* | 8/2004 | Jin .............................. 313/309 |
| 2006/0163560 A1* | 7/2006 | Choi ........................... 257/40 |

* cited by examiner

*Primary Examiner*—A. Sefer
*Assistant Examiner*—Ermias Woldegeorgis
(74) *Attorney, Agent, or Firm*—Bacon & Thomas, PLLC

(57) ABSTRACT

The present invention is to provide a "fabricating method for quantum dot active layer of LED by nano-lithography" for fabricating out a new active layer of LED of nano quantum dot structure in more miniature manner than that of the current fabricating facilities to have high quality LED with features in longer light wavelength, brighter luminance and lower forward bias voltage by directly using the current fabricating facilities without any alteration or redesign of the precision.

6 Claims, 14 Drawing Sheets

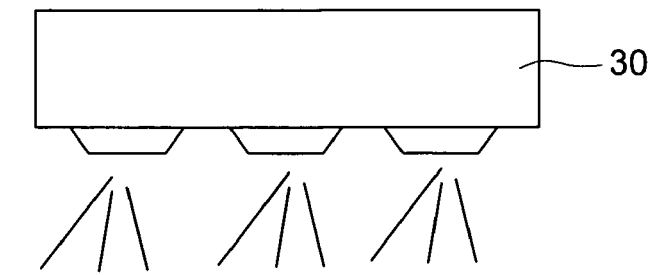
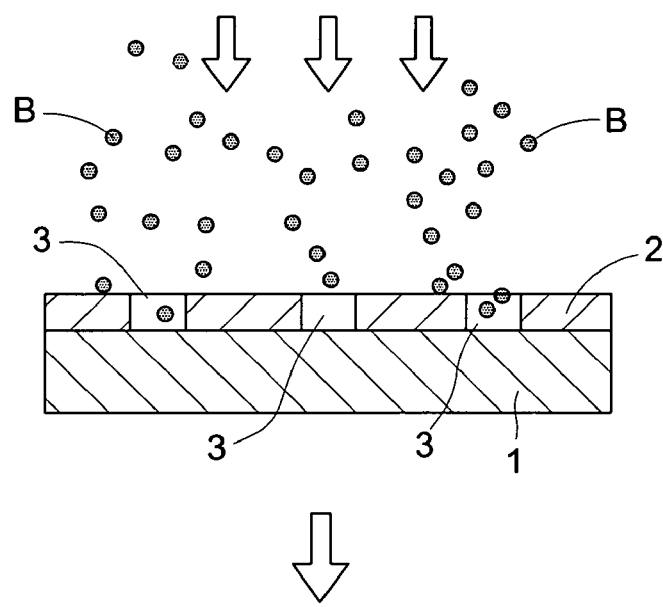
*Fig.3a*
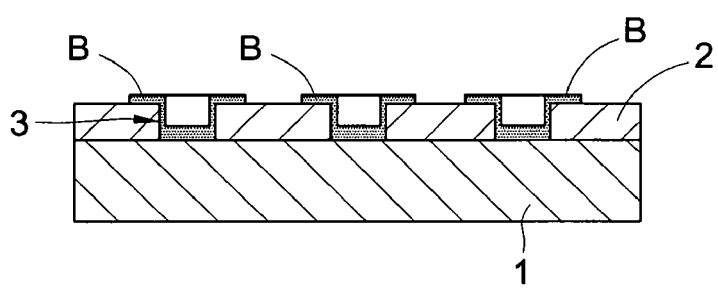
*Fig.3b*
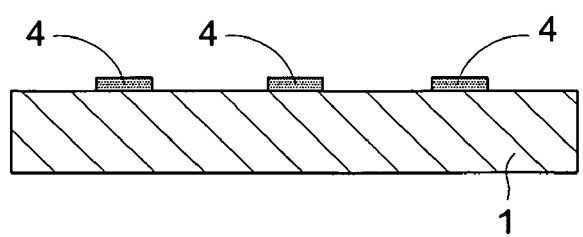
*Fig.3c*

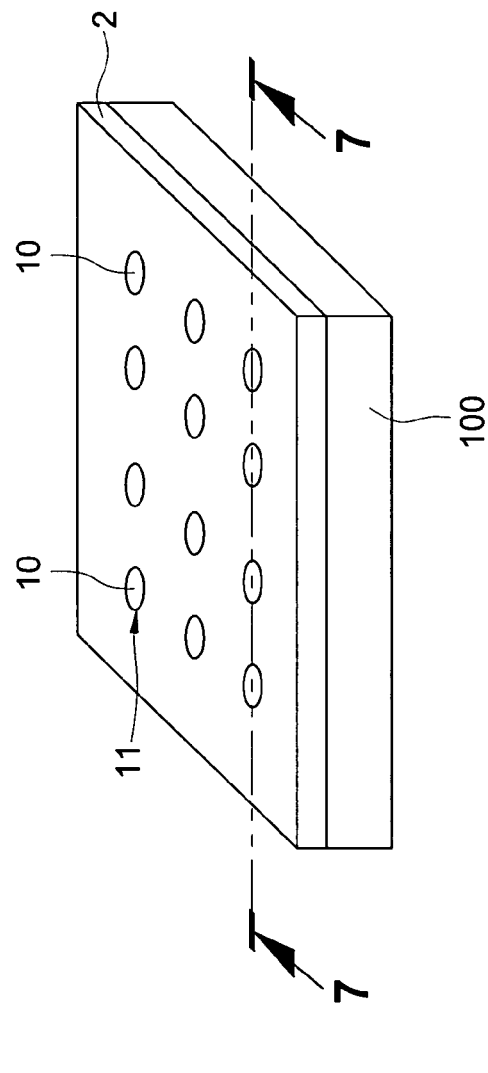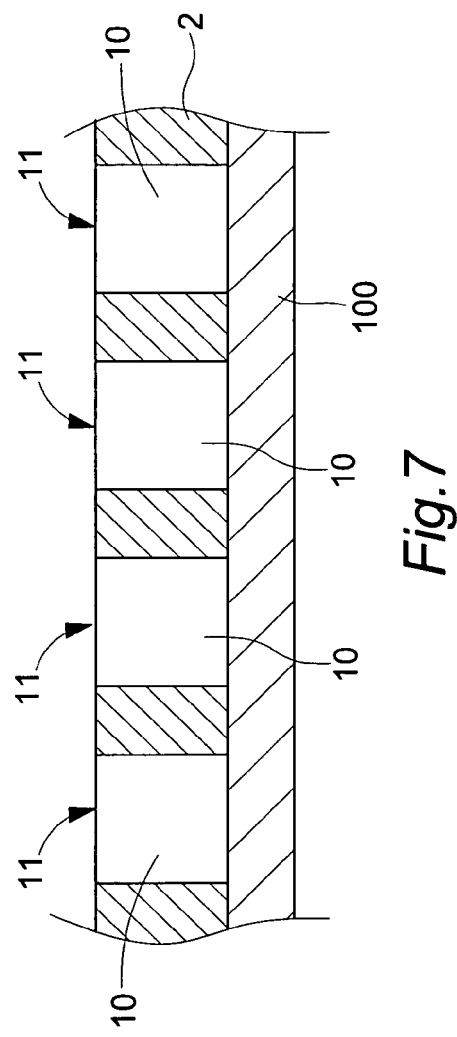

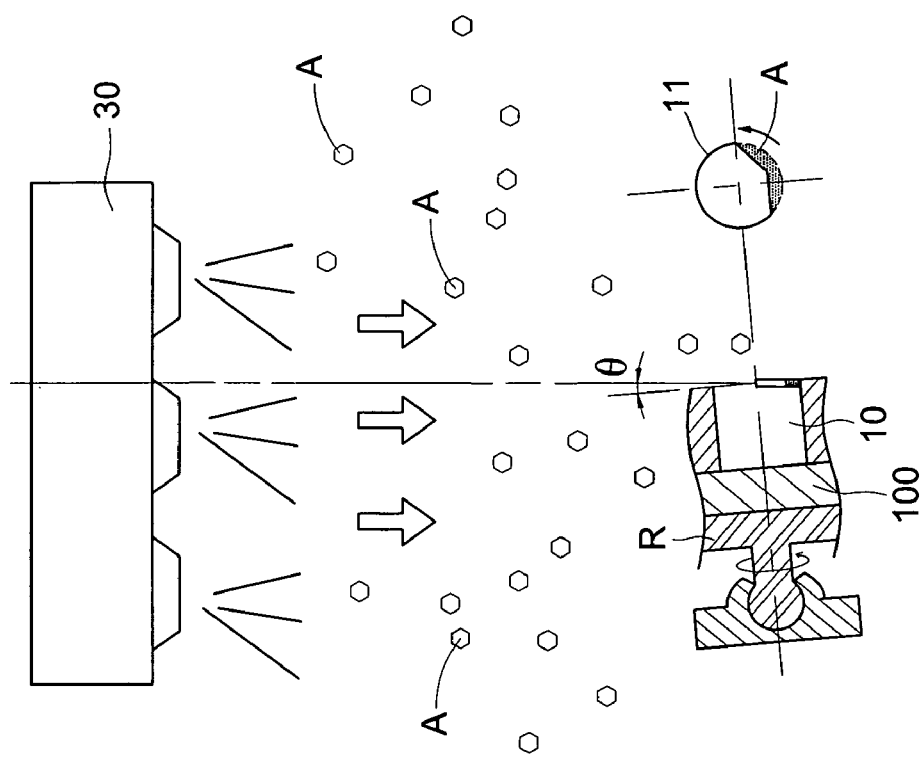
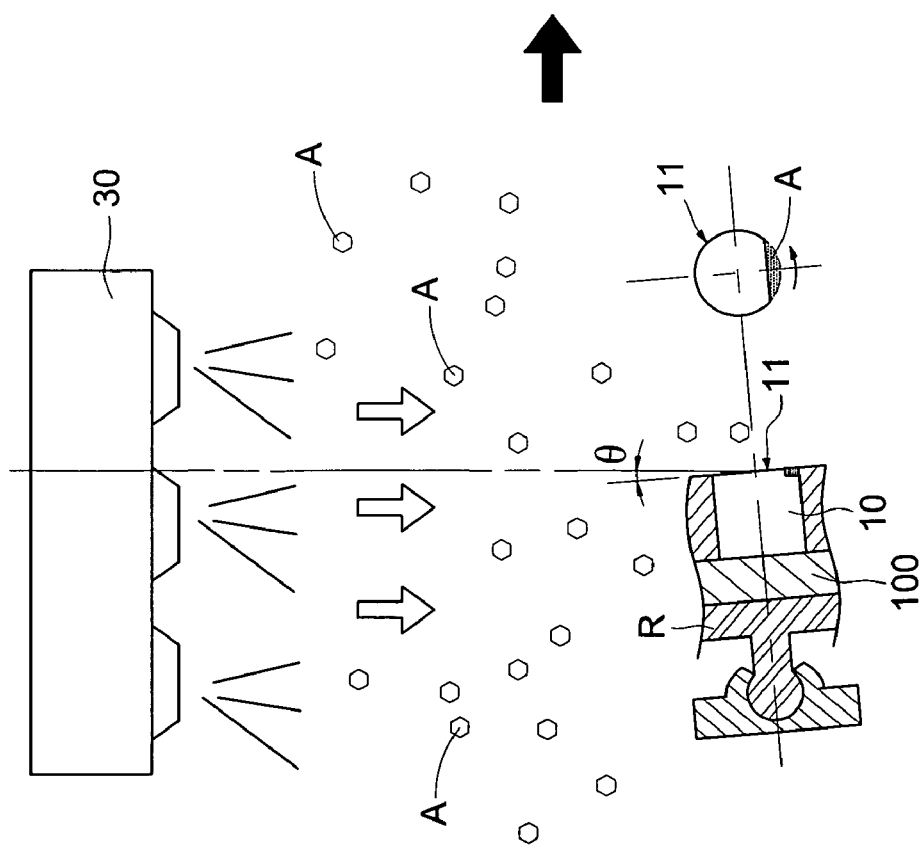
Fig.8a
Fig.8b

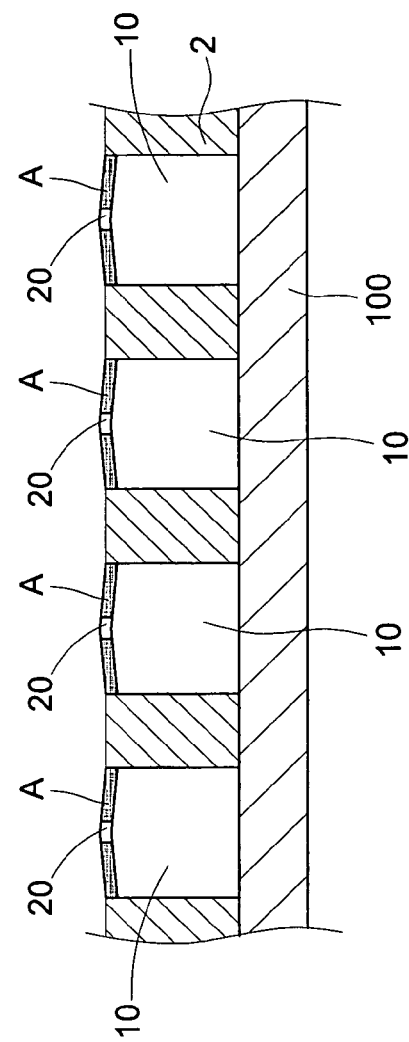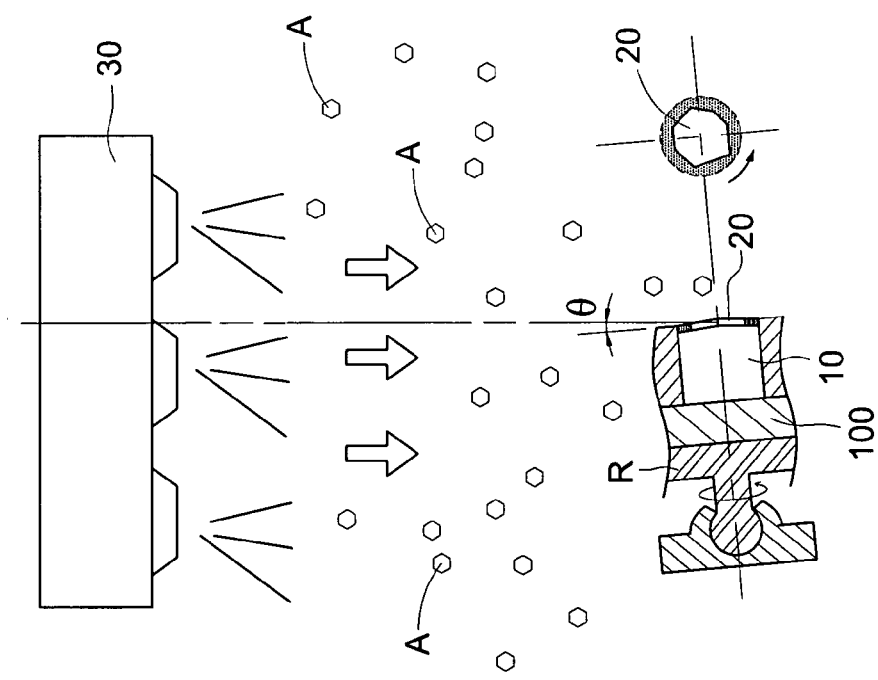
Fig. 9
Fig. 8g

FABRICATING METHOD FOR QUANTUM DOT OF ACTIVE LAYER OF LED BY NANO-LITHOGRAPHY

This application claims the benefit of provisional U.S. Patent Application No. 60/929,500, field Jun. 29, 2007.

FIELD OF THE PRESENT INVENTION

The present invention relates to the fabrication of active layer for LED, particularly for the fabricating method in directly employing current photolithography to produce LED with active layer in nano quantum dot grade so that the fabricated LED has high quality features in longer light wavelength, brighter luminance and lower forward bias voltage.

BACKGROUND OF THE INVENTION

The light emitting diode (LED) is a kind of semiconductor component. Comparing to the general lighting bulb, the service life of the LED is longer than that of in 50~100 times; the power consumption of the LED is only ⅓~⅕ that of the general lighting bulb. Owing to the LED is a tiny lighting source with many advantages such as aforesaid, it will probably dominate the future lighting market and become a new lighting source with benefits in energy saving and environment protecting feature to replace the conventional tungsten and mercury lighting sources in 21 century.

For the illuminating luminance (also known as brightness colloquially), owing to the differences in used material and the epitaxy technique, the LED can be classified into two categories that high luminance LED is the brightness thereof being over 1 candle unit while the low luminance LED is the brightness thereof being less than 1 candle unit. In the initial cradle stages, the popular epitaxy techniques employed are the Hydride Vapor Phase Epitaxy (HVPE), Molecular Beam Epitaxy (MBE), Metal-Organic Vapor Phase Epitaxy (MOVPE) and the like.

For material used in the LED, the physical and chemical properties will considerably change when the dimension of the LED is reduced down to the nano scale. The nano-technology (NT) will become one of the most important technologies as the application of the nano-technology (NT) onto the LED can greatly improve the performance of the LED.

As shown in FIGS. 1 through 3, the nano-structure is produced from conventional nano-lithography. The fabricating steps are as below: (A): Firstly, layout an expected nano pattern Q on a photomask M, then put said photomask M on the top surface of a substrate 1, which is spread with a photoresist 2 (as shown in the FIG. 1); (B): Secondly, pass a light beam e through said nano pattern Q on said photomask M so as to have same pattern as said nano pattern Q on said photoresist 2, which spreads on said substrate 1, by exposure and development to define a nano-aperture 3 structure (as shown in the FIG. 2); (C): Thirdly, by means of a deposit source device 30, directly deposit a deposit material B of gas molecule or atom state on the surroundings and bottom of said nano-aperture 3 (as shown in the FIGS. 3a and 3b); and (D): Finally, selectively remove said photo-resist 2 by a solution; thereby a nano quantum dot 4 of nano structure is formed on the surface of said substrate 1 (as shown in the FIG. 3c).

The conventional process aforesaid is confined to the precision limit of the existing photolithography such that the current best precise nano-scale can only reach 60~65 nm; Hence, the nano-scale of said nano-aperture 3 from photomask M of pattern transferring photolithography is over 60 nm; Thereby, the nano-scale of said nano quantum dot 4 fabricated from these equipment is also over 60 nm relatively; Thus, the physical size limit of said conventional nano-devices of nano-structure are still in the range of over 60 nm; Therefore, how to breakthrough this bottleneck such that making the nano-scale of nano-aperture 3 be smaller becomes the impending crucial technical tough question of all experts in various fields; The solution being subject to the industrial practical feasibility in mass production and cost-effective economical principle so that the choice of means in technical breakthrough becomes more difficult; The scientists who understand the nano-science and the experts who familiarize with nano-technology are all aware of the benefits of working out the nano structure being smaller than 50 nm or even 12 nm, but none of better solution or effective technical breakthrough is proposed, announced or applied, not to mention the fabricating product of LED with the active layer in nano quantum dot grade accordingly.

SUMMARY OF THE INVENTION

The primary object of the present invention is to fabricate out a new active layer of LED of nano quantum dot structure in more miniature manner than that of the current fabricating facilities by directly using the current fabricating facilities without any alteration or redesign of the precision so that not only the density of the active layer in unit area can be significantly increased in more evenness manner but also the produced LED has high quality features in longer light wavelength, brighter luminance and lower forward bias voltage.

The other object of the present invention is to provide a "fabricating method for quantum dot active layer of LED by nano-lithography" comprises process steps as below: (a): Firstly, deposit a sealant of gas molecule or atom state on top-opening of a nano cylindrical pore on an epitaxy substrate so that the diameter of said top-opening gradually reduce to become a reduced nano-aperture, whose opening diameter is smaller than that of said top-opening; (b): Secondly, firmly place the epitaxy substrate on a tilt-rotary console having capability of 3-D tilt with rotation in horizontal direction and directly pass a deposit material of gas molecule or atom state perpendicularly through said reduced nano-aperture so that a nano quantum dot of nano structure with diameter being same as that of the reduced nano-aperture is directly formed on the surface of said epitaxy substrate, which being laid beneath the bottom of said nano cylindrical pore; (c): Thirdly, tilt rightwards the epitaxy substrate together with said tilt-rotary console in a right tilt angle by said reduced nano-aperture as center and re-pass the deposit material of gas molecule or atom state through said reduced nano-aperture in same direction as the previous direction so that another nano quantum dot of nano structure with diameter being same as that of the reduced nano-aperture is directly formed on the surface of said epitaxy substrate with position at right side of the previous nano quantum dot; (d): Fourthly, tilt leftwards the epitaxy substrate together with said tilt-rotary console in a left tilt angle by said reduced nano-aperture as center and re-pass the deposit material of gas molecule or atom state through said reduced nano-aperture in same direction as the previous direction so that the other nano quantum dot of nano structure with diameter being same as that of the reduced nano-aperture is directly formed on the surface of said epitaxy substrate with position at left side of the previous nano quantum dot; and (e): Finally, properly rotate the epitaxy substrate together with said tilt-rotary console in a rotation angle by said reduced nano-aperture as center and re-pass the deposit material of gas molecule or atom state through said reduced nano-aperture in same direction as the previous direction so that the a further nano quantum dot of nano structure with diameter being same as that of the reduced nano-aperture is directly formed on the surface of said epitaxy substrate with position at front side of the previous nano quantum dot.

BRIEF DESCRIPTION OF THE DRAWINGS

FIG. 3a is the first step in flow chart showing the fabrication of nano quantum dot structure according to conventional nano-technology.

FIG. 3b is the second step in flow chart showing the fabrication of nano quantum dot structure according to conventional nano-technology.

FIG. 3c is the third step in flow chart showing the fabrication of nano quantum dot structure according to conventional nano-technology.

FIG. 6 is the perspective schematic view showing the formation of nano cylindrical pore according to build-up method or build-down method of conventional nano technological process.

FIG. 7 is the cross section view taken along the section line 7-7 of the FIG. 6.

FIG. 8a is the first step in flow chart showing the implementing process of a reduced nano-aperture on the top of nano cylindrical pore for the present invention.

FIG. 8b is the second step in flow chart showing the implementing process of a reduced nano-aperture on the top of nano cylindrical pore for the present invention.

FIG. 8g is the seventh step in flow chart showing the implementing process of a reduced nano-aperture on the top of nano cylindrical pore for the present invention.

FIG. 9 is the cross section view showing the implementing completion of a nano aperture on the top of nano cylindrical pore for the present invention.

FIG. 11a is the cross section view taken along the section line 11a-11a of the FIG. 11.

DETAILED DESCRIPTION OF THE PREFERRED EMBODIMENTS

Figure 1:
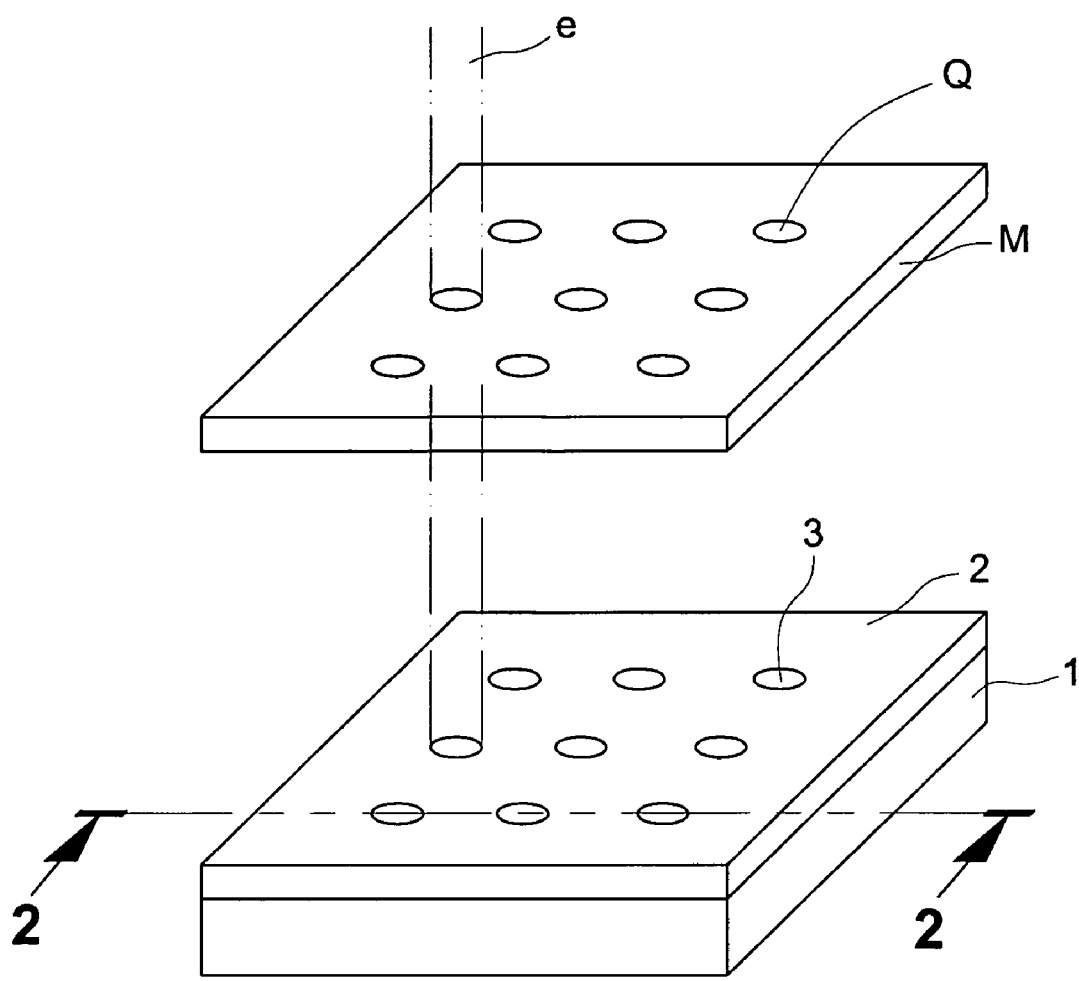
FIG. 1 is the perspective schematic view showing the photomask and substrate according to conventional nano pattern imprinting in photolithography of nano-technological process.
Figure 2:
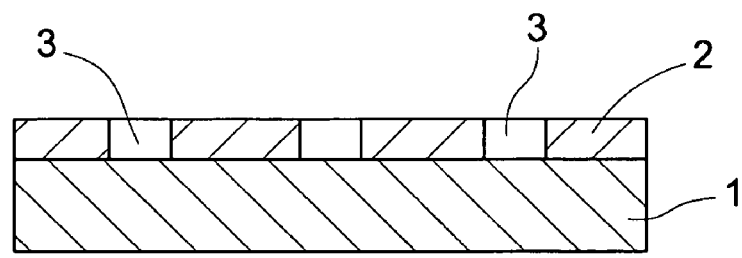
FIG. 2 is the cross section view taken along the section line 2-2 of the FIG. 1.
Figure 4:
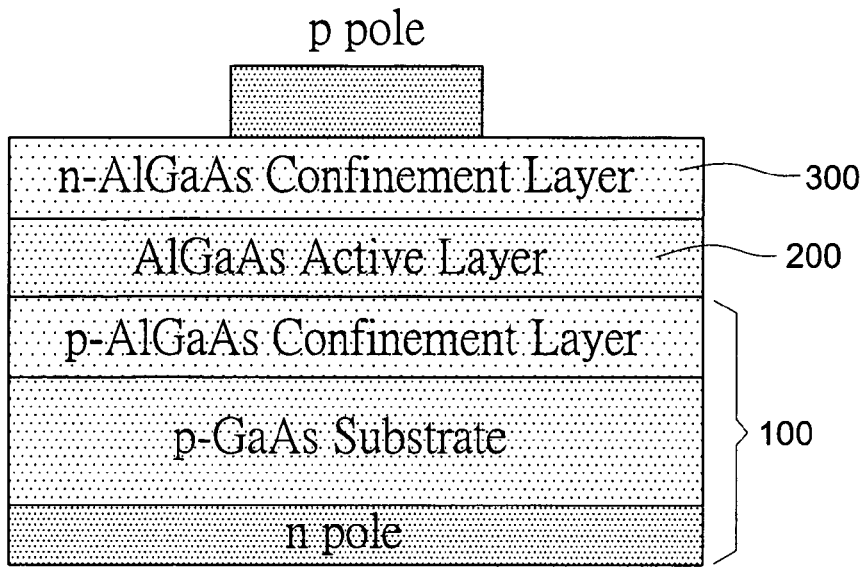
FIG. 4 is the cross section view showing the double hetero structure (DH) for the conventional LED.
Figure 5:
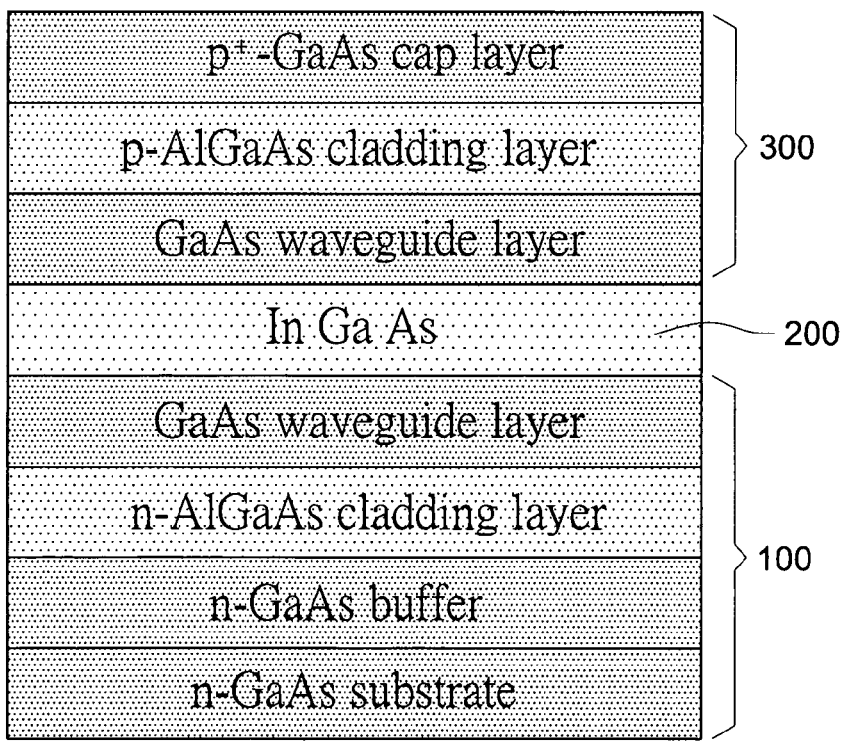
FIG. 5 is the cross section view showing the double hetero structure in dual combination (DDH) for the conventional LED.
Figure 8D:
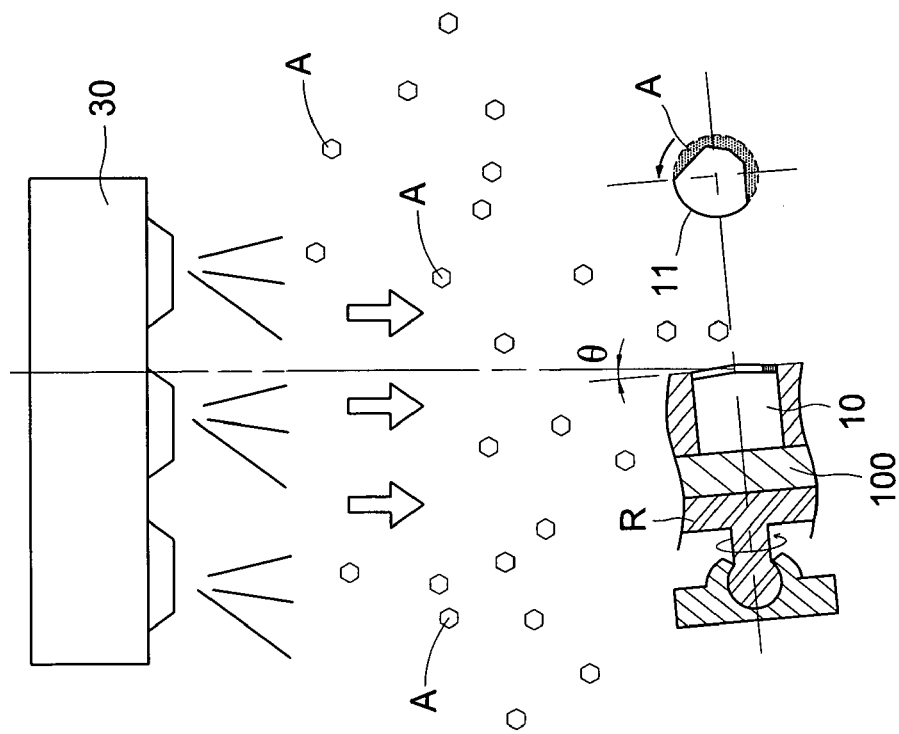
FIG. 8d is the fourth step in flow chart showing the implementing process of a reduced nano-aperture on the top of nano cylindrical pore for the present invention.
Figure 8C:
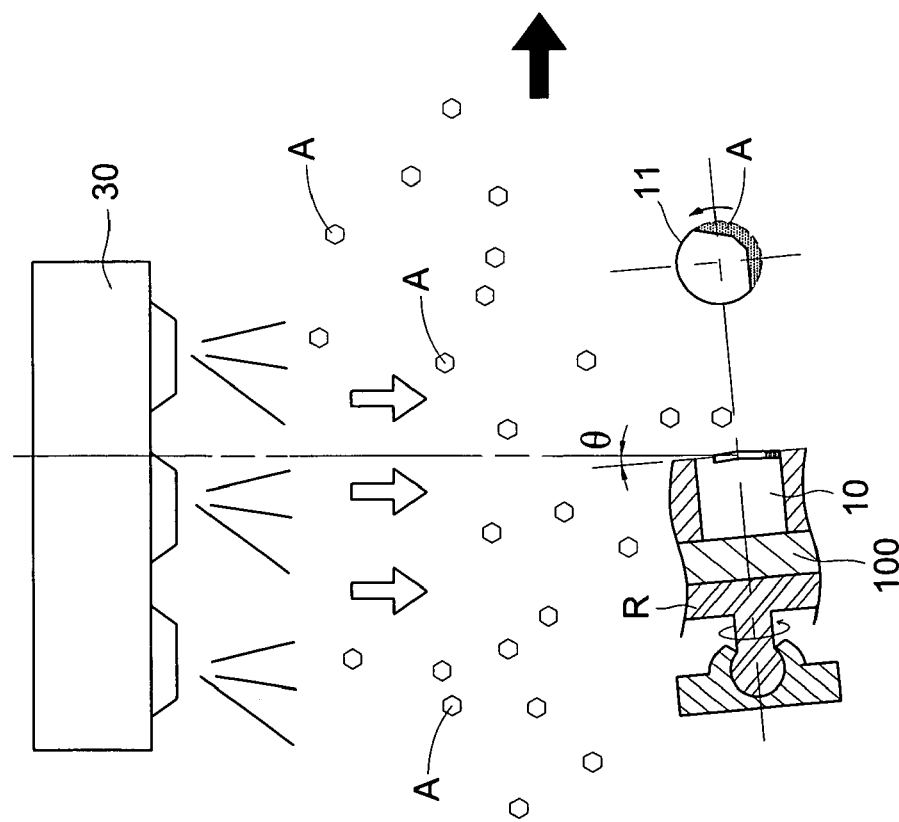
FIG. 8c is the third step in flow chart showing the implementing process of a reduced nano-aperture on the top of nano cylindrical pore for the present invention.
Figure 8F:
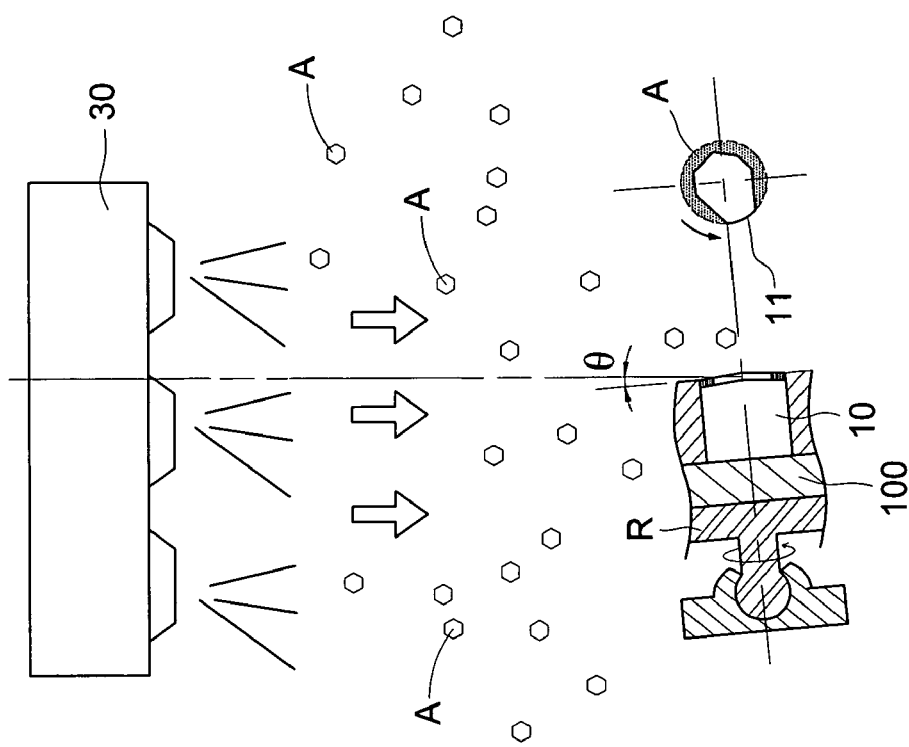
FIG. 8f is the sixth step in flow chart showing the implementing process of a reduced nano-aperture on the top of nano cylindrical pore for the present invention.
Figure 8E:
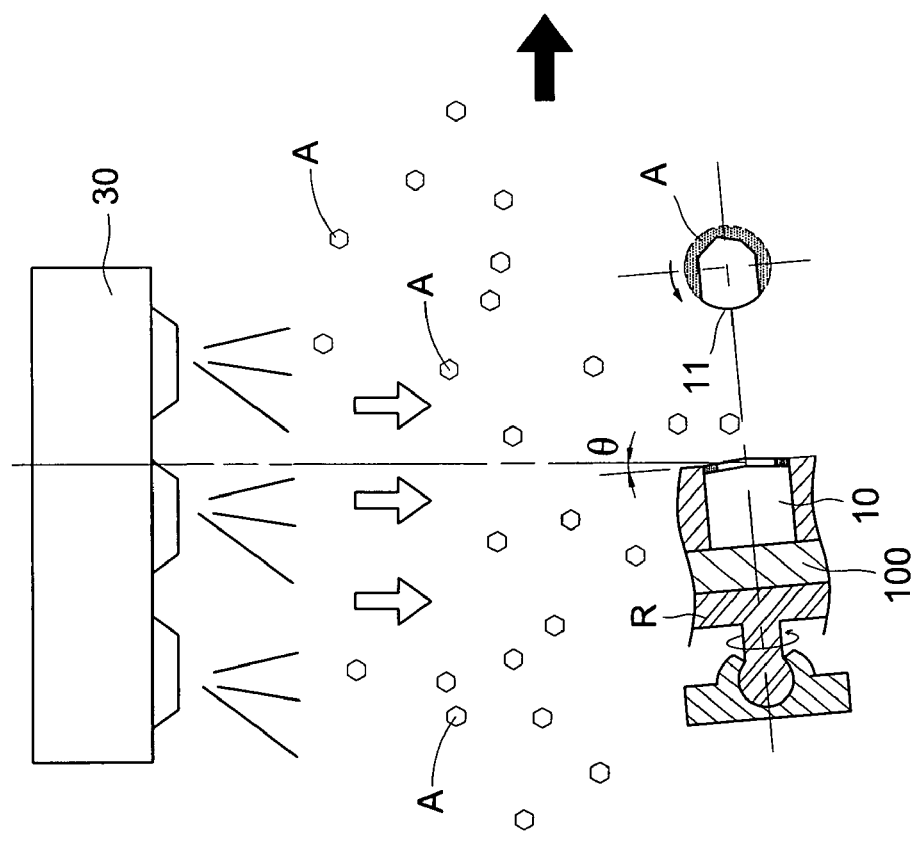
FIG. 8e is the fifth step in flow chart showing the implementing process of a reduced nano-aperture on the top of nano cylindrical pore for the present invention.
Figure 10:
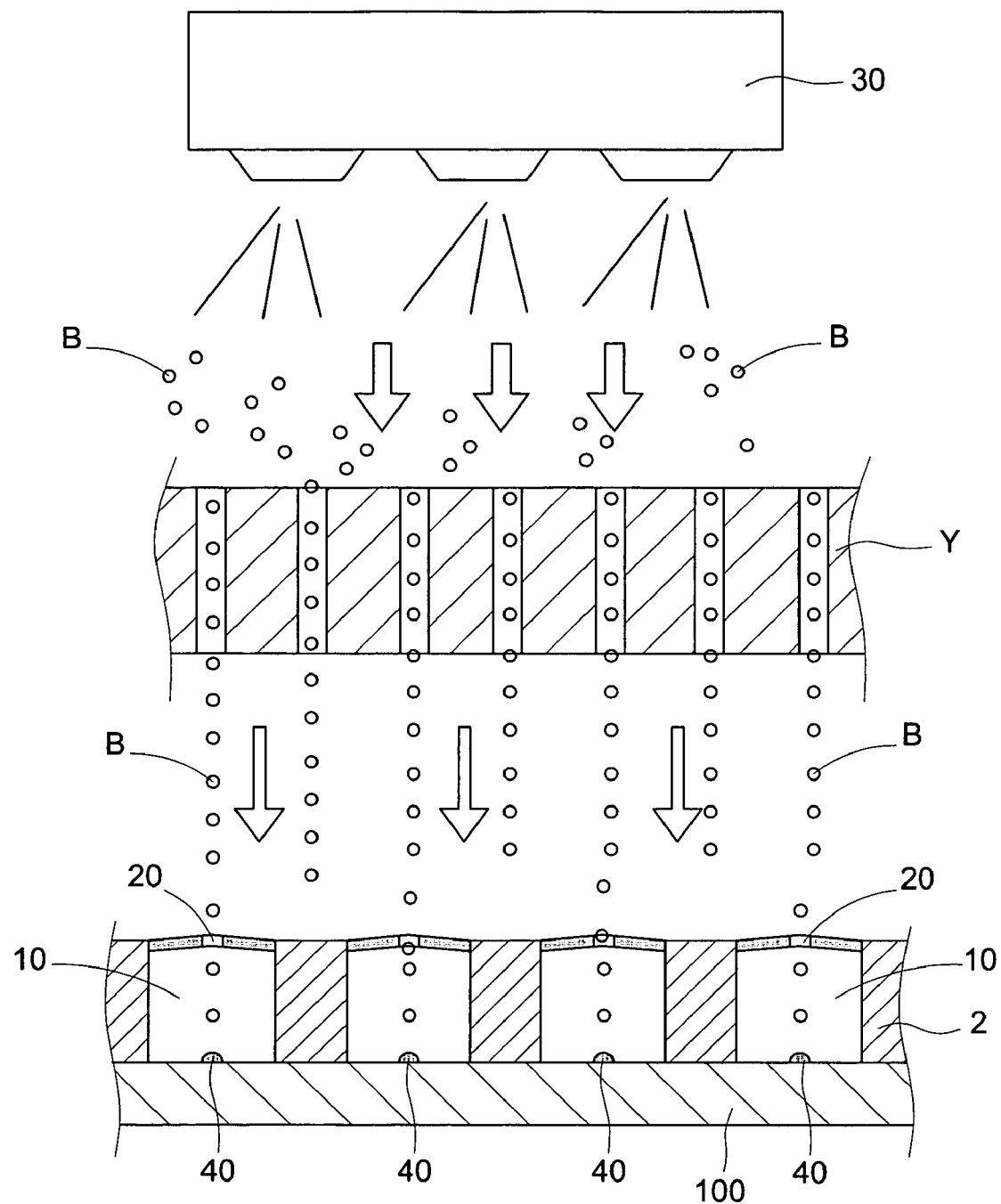
FIG. 10 is the operation schematic view showing the formation of nano quantum dot on the surface of epitaxy substrate via a reduced nano-aperture for the present invention.
Figure 11:
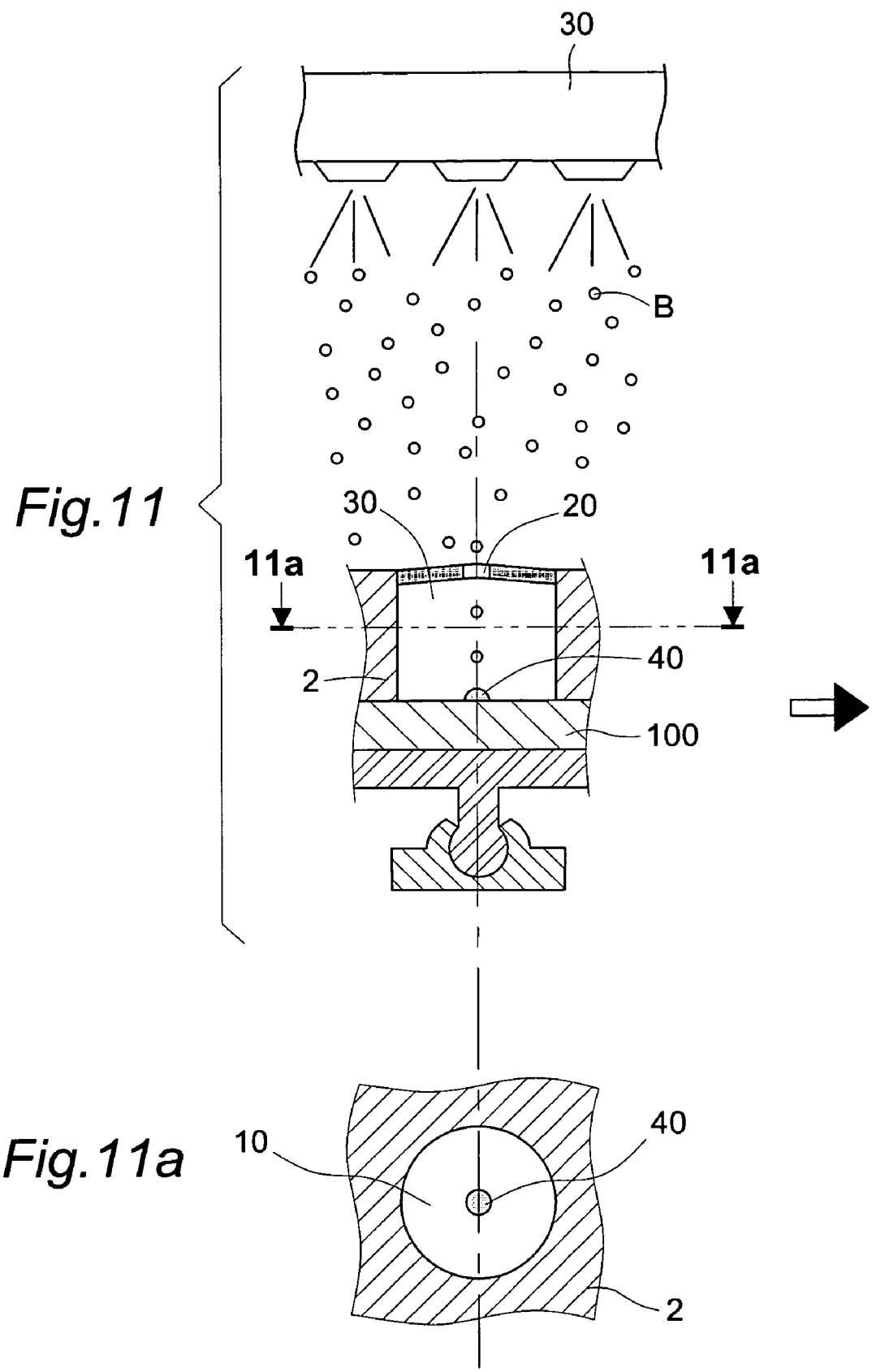
FIG. 11 is the first step in operation schematic view showing the implementing process of plural nano quantum dots on the surface of epitaxy substrate via a reduced nano-aperture for the present invention.
Figures 12, 12A:
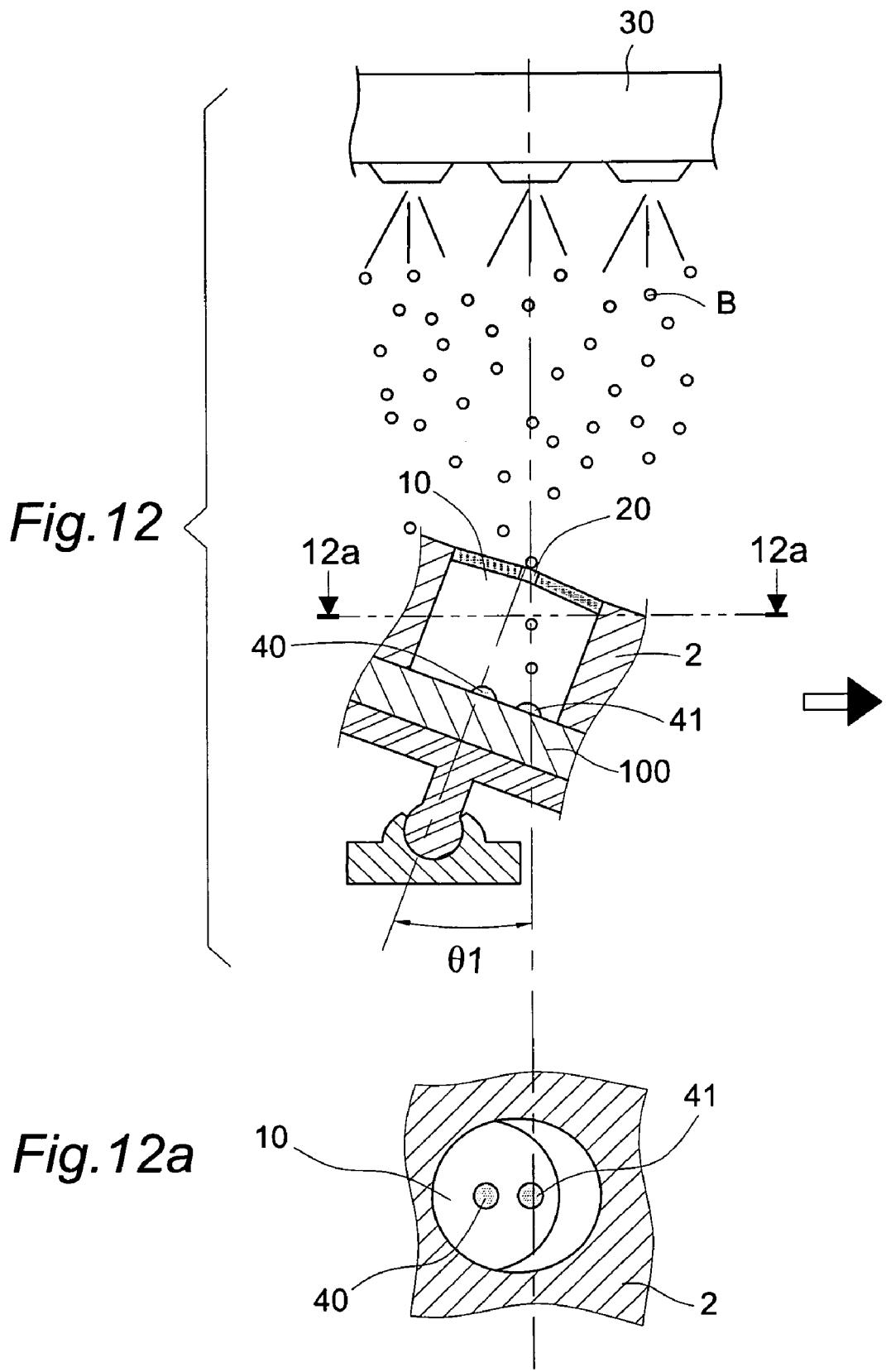
FIG. 12 is the second step in operation schematic view showing the implementing process of plural nano quantum dots on the surface of epitaxy substrate via a reduced nano-aperture for the present invention.
FIG. 12a is the cross section view taken along the section line 12a-12a of the FIG. 12.
Figures 13, 13A:
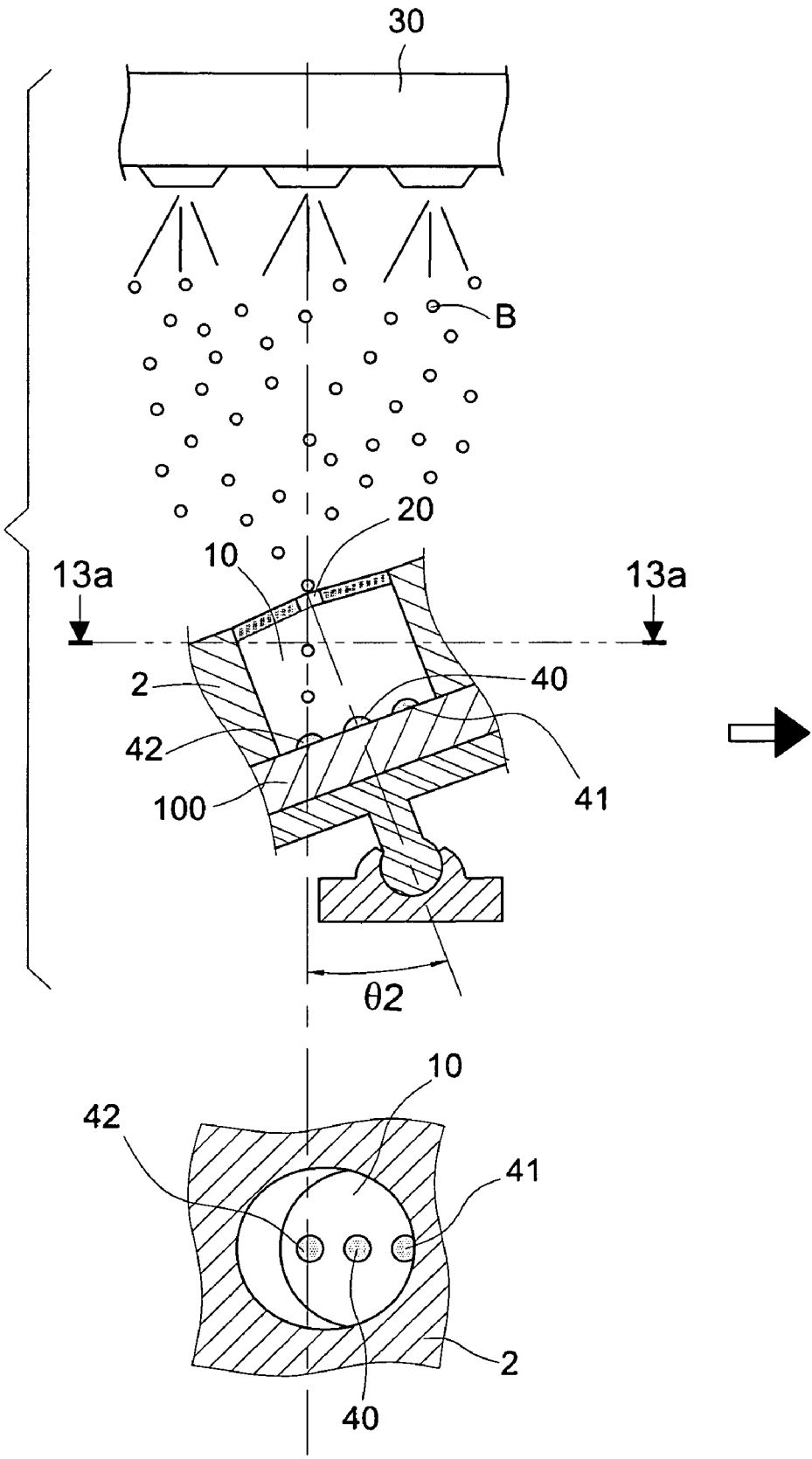
FIG. 13 is the third step in operation schematic view showing the implementing process of plural nano quantum dots on the surface of epitaxy substrate via a reduced nano-aperture for the present invention.
FIG. 13a is the cross section view taken along the section line 13a-13a of the FIG. 13.

Please refer to FIGS. 4 through 6. FIG. 4 is the cross section view showing the double hetero structure (DH) for the conventional AlGaAs LED while FIG. 5 is the cross section view showing the double hetero structure in dual combination (DDH) for the conventional InGaAs LED. The present invention pinpoints the active layer in the AlGaAs LED and InGaAs LED to provide a "fabricating method for quantum dot active layer of LED by nano-lithography". Accordingly, FIG. 6 shows the formation and obtainment of nano cylindrical pore 10 on an epitaxy substrate 100 (p confining layer or n confining layer) in accordance with build-up method or build-down method of conventional nano lithography technological process. The minimum size of said conventional nano cylindrical pore 10 is only down to 60 nm or 60 nm over; The alternative to implement the fabricating process includes options of photolithography, nano-imprinting, MBE (Molecular Beam Epitaxy) and MOVCD (Metal-Organic Vapor phase Chemical Deposition in Epitaxy); However, the ways of these conventional technologies aforesaid will be not detailed described here as their feature and know-how being not aspired after by the present invention.

Figure 14:
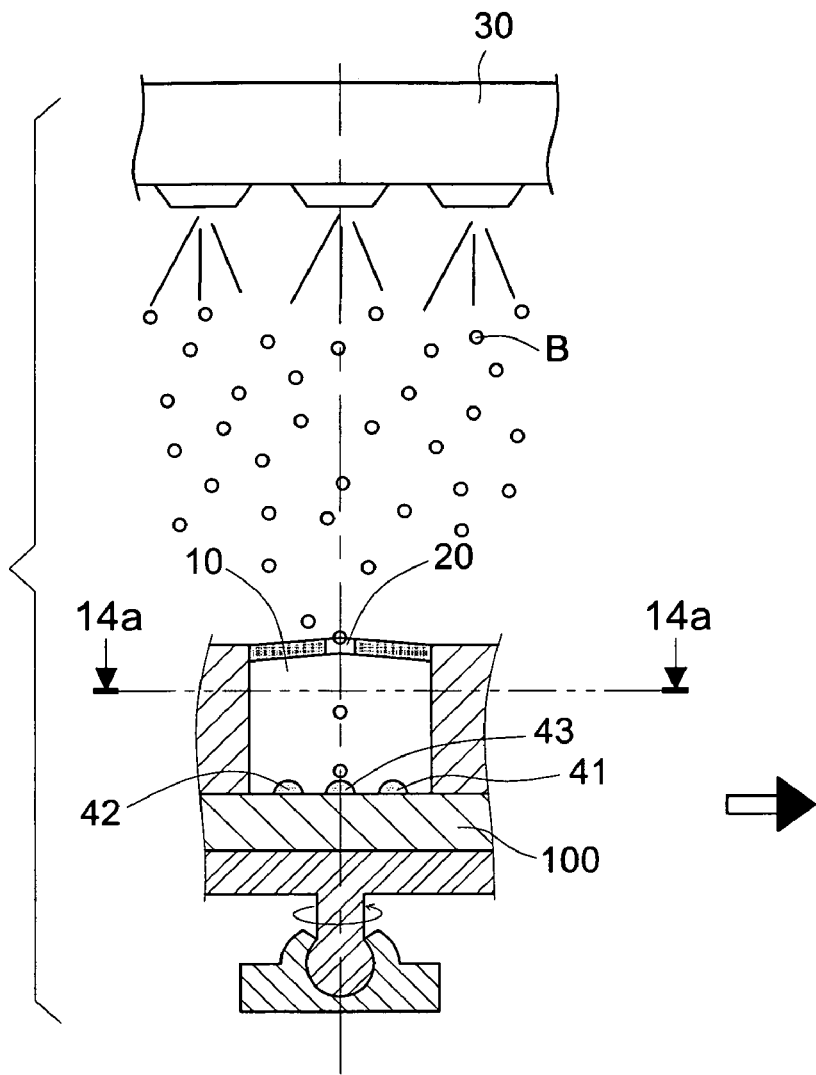
FIG. 14 is the fourth step in operation schematic view showing the implementing process of plural nano quantum dots on the surface of epitaxy substrate via a reduced nano-aperture for the present invention.
Figure 14A:
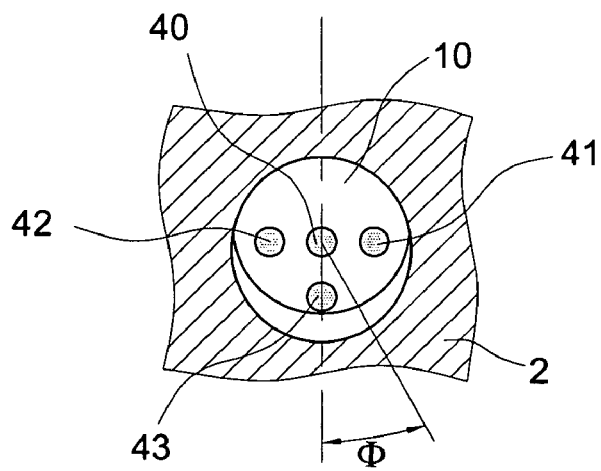
FIG. 14a is the cross section view taken along the section line 14a-14a of the FIG. 14.

Please further refer to FIGS. 6 through 15. The process steps of "fabricating method for quantum dot active layer of LED by nano-lithography" in accordance with the present invention comprise:

(a): Firstly, deposit a sealant A, which is also known as sealing material colloquially, of gas molecule or atom state on top-opening 11 of a nano cylindrical pore 10 on an epitaxy substrate 100 (namely p confining layer or n confining layer) (as shown in the FIG. 7) so that the diameter of said top-opening 11 gradually reduce to become a reduced nano-aperture 20, whose opening diameter is smaller than that of said top-opening 11 (as shown in the FIGS. 8g and 9);

(b): Secondly, firmly place the epitaxy substrate 100 on a tilt-rotary console R having capability of 3-D tilt with rotation in horizontal direction and directly pass a deposit material B of gas molecule or atom state perpendicularly through said reduced nano-aperture 20 (as shown in the FIG. 10) so that a nano quantum dot 40 of nano structure with diameter being same as that of the reduced nano-aperture 20 is directly formed on the surface of said epitaxy substrate 100, which being laid beneath the bottom of said nano cylindrical pore 10 (as shown in the FIGS. 11 and 11*a*);

(c): Thirdly, tilt rightwards the epitaxy substrate 100 together with said tilt-rotary console R in a right tilt angle θ1 by said reduced nano-aperture 20 as center and re-pass the deposit material B of gas molecule or atom state through said reduced nano-aperture 20 in same direction as the previous direction so that another nano quantum dot 41 of nano structure with diameter being same as that of the reduced nano-aperture 20 is directly formed on the surface of said epitaxy substrate 100 with position at right side of the previous nano quantum dot 40 (as shown in the FIGS. 12 and 12*a*);

(d): Fourthly, tilt leftwards the epitaxy substrate 100 together with said tilt-rotary console R in a left tilt angle θ2 by said reduced nano-aperture 20 as center and re-pass the deposit material B of gas molecule or atom state through said reduced nano-aperture 20 in same direction as the previous direction so that the other nano quantum dot 42 of nano structure with diameter being same as that of the reduced nano-aperture 20 is directly formed on the surface of said epitaxy substrate 100 with position at left side of the previous nano quantum dot 40 (as shown in the FIGS. 13 and 13*a*);

(e): Fifthly, properly rotate the epitaxy substrate 100 together with said tilt-rotary console R in a rotation angle Φ by said reduced nano-aperture 20 as center and re-pass the deposit material B of gas molecule or atom state through said reduced nano-aperture 20 in same direction as the previous direction so that the a further nano quantum dot 43 of nano structure with diameter being same as that of the reduced nano-aperture 20 is directly formed on the surface of said epitaxy substrate 100 with position at front side of the previous nano quantum dot 40 (as shown in the FIGS. 14 and 14*a*);

(f): Sixthly, through reiterating the process steps (b) through (e) together with through properly adjusting the tilt angle θ together with rotation angle Φ parameters, a further certain plurality of desired nano quantum dots 40, 41, 42 and 43 can be directly formed on the surface of said epitaxy substrate 100 in desired position similarly (as shown in the FIG. 15 and associated top view); and (g): Finally, by means of solution rinsing (i.e. wet etching) or gas etching (i.e. dry etching), remove all the nano cylindrical pores 10 on the epitaxy substrate 100 (as shown in the FIG. 15), many active layers of nano quantum dots in same dimension for the LED can be fabricated on the epitaxy substrate 100 in high density and even distribution manner.

Figure 15:
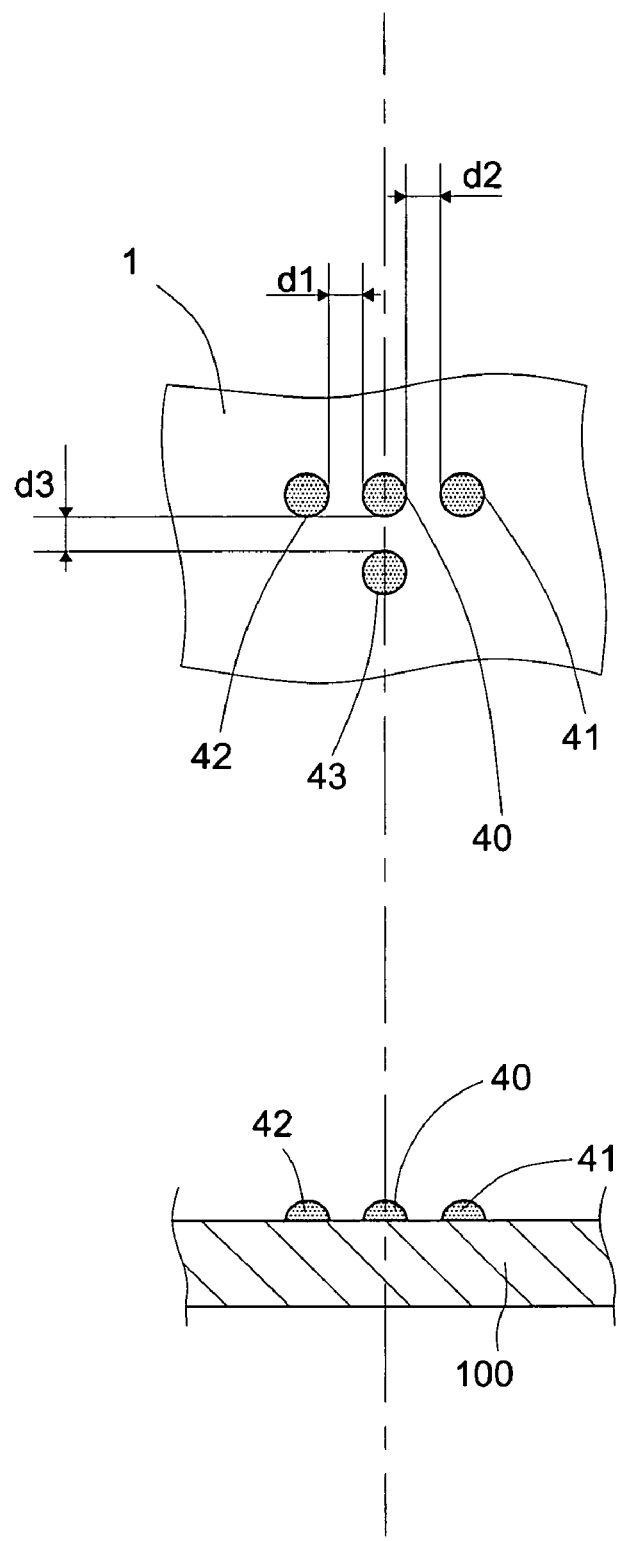
FIG. 15 is the cross section schematic view showing the implementing completion of quantum dot active layer of LED on the surface of epitaxy substrate via reduced nano aperture for the present invention.

Wherein, if the tilt angle θ1 in the step (c) equals to the tilt angle θ2 in the step (d), then the distance d1 between the nano quantum dot 40 and the quantum dot 41 will equal the distance d2 between the nano quantum dot 40 and the quantum dot 42 (as shown in associated top view of the FIG. 15). Besides, the distance d3 between the nano quantum dot 40 and the quantum dot 43 is controlled by the magnitude of the rotation angle Φ (as shown in the FIG. 14*a*); Therefore, by means of the easy positional control of the tilt angles θ1 and θ2 as well as the rotation angle Φ, the requirements for the expected distances among the nano quantum dots 40, 41, 42 and 43 as well as the desired density of the nano quantum dot over unit area are achievable precisely. Even the requirement for each nano quantum dot having different respective material constituent can be easily met by merely selecting different suitable deposit material B thereof. Thereby, the fabricating method of the present can be entirely applied on the LED field for producing satisfactory active layer in nano quantum dot grade through normal process and operation under room temperature. Thus, for the present invention, not only the overall effect is significant, but also the manufacturing cost is reduced to cheap relatively.

Moreover, the implementing process of the step (a) aforesaid in forming said reduced nano-aperture 20 on said top-opening 11 of said nano cylindrical pore 10 is shown in the FIGS. 8*a* through 8*g*, which comprises sub-steps as below:

(1): Firstly, firmly place said epitaxy substrate 1 on a tilt-rotary console R having capability of 3-D tilt with rotation and adjust said tilt-rotary console R in tilt angle θ (as shown in a view of the FIG. 8*a*, namely the included angle value of the central line of said top-opening 11 of said nano cylindrical pore 10 and the output direction of a deposit source device 30 is 90°-θ°) so that a sealing material A of gas molecule or atom state can partially deposit on the end rim of said top-opening 11 of said nano cylindrical pore 10 (as shown in The FIG. 8*a* and associated lateral section view marked with A); and (2): Secondly, let said tilt-rotary console R keep in tilt angle θ inclination, and gradually rotate it one complete rotation (as respectively shown in the FIGS. 8*b*, 8*c*, 8*d*, 8*e*, 8*f* and each of associated lateral section view thereof marked with A respectively), thereby a reduced nano-aperture 20 with diameter being smaller than that of said top-opening 11 is formed on said top-opening 11 of said nano cylindrical pore 10 by deposition of said sealant A of gas molecule or atom state (as shown in the FIG. 8*g* and associated lateral section view). Wherein, the rotational number of said tilt-rotary console R can be increased so as to get a smaller orifice diameter in said reduced nano-aperture 20; Besides, the size of the orifice diameter in said reduced nano-aperture 20 can be real-time monitored by membrane thickness meter, which is available in the current market, to serve as basis in control the rotational speed of said tilt-rotary console R; Thus, the expected reduced nano-aperture 20 with desired diameter can be obtained in this way so that the density requirement of active layer structure of quantum dots for the LED can be met.

Furthermore, the epitaxy substrate 100 in the step (a) aforesaid can be obtained through conventional fabricating processes such as Liquid Phase Epitaxy (LPE), Hydride Vapor Phase Epitaxy (HVPE), Molecular Beam Epitaxy (MBE), Metal-Organic Vapor Phase Epitaxy (MOVPE) and the like.

Moreover, the output of said deposit material B of gas molecule or atom state in step (b) aforesaid is supplied by said deposit source device 30; In order to regulate said first deposit material B of gas molecule or atom state to pass through said reduced nano-aperture 20 in manner of straight line path, a collimator Y can be installed between said deposit source device 30 and said reduced nano-aperture 20 (as shown in the FIG. 10) so that the moving direction of said first deposit material B of gas molecule or atom state becomes more coherent; Thus, the reliability of each nano quantum dot 40, 41, 42 or 43 forming on the surface of said epitaxy substrate 100 is enhanced.

Therefore, for the active layer of nano quantum dots in the LED produced by the fabricating steps (a) through (g) of the present invention, the dimensional size of each nano quantum dot and the respective distance among all the nano quantum dots can be completely controlled in 100 percentage precise manner so that the performance and the optical properties are very stable, which can not only be further employed to create an effective and reliable montage effect but also to considerably improve various photoelectrical effect for LED. Thus, the fabricating method of the present invention is very valuable in industrial practical application indeed.

What is claimed is:

1. A "fabricating method for quantum dot active layer of LED by nano-lithography" comprises process steps as below:

(a): Firstly, deposit a sealant of gas molecule or atom state on top-opening of a nano cylindrical pore on an epitaxy substrate so that the diameter of said top-opening gradually reduce to become a reduced nano-aperture, whose opening diameter is smaller than that of said top-opening;

(b): Secondly, firmly place the epitaxy substrate on a tilt-rotary console having capability of 3-D tilt with rotation in horizontal direction and directly pass a deposit material of gas molecule or atom state perpendicularly through said reduced nano-aperture so that a nano quantum dot of nano structure with diameter being same as that of the reduced nano-aperture is directly formed on the surface of said epitaxy substrate, which being laid beneath the bottom of said nano cylindrical pore;

(c): Thirdly, tilt rightwards the epitaxy substrate together with said tilt-rotary console in a right tilt angle by said reduced nano-aperture as center and re-pass the deposit material of gas molecule or atom state through said reduced nano-aperture in same direction as the previous direction so that another nano quantum dot of nano structure with diameter being same as that of the reduced nano-aperture is directly formed on the surface of said epitaxy substrate with position at right side of the previous nano quantum dot;

d): Fourthly, tilt leftwards the epitaxy substrate together with said tilt-rotary console in a left tilt angle by said reduced nano-aperture as center and re-pass the deposit material of gas molecule or atom state through said reduced nano-aperture in same direction as the previous direction so that another nano quantum dot of nano structure with diameter being same as that of the reduced nano-aperture is directly formed on the surface of said epitaxy substrate with position at left side of the previous nano quantum dot;

(e): Fifthly, properly rotate the epitaxy substrate together with said tilt-rotary console in a rotation angle by said reduced nano-aperture as center and re-pass the deposit material of gas molecule or atom state through said reduced nano-aperture in same direction as the previous direction so that a further nano quantum dot of nano structure with diameter being same as that of the reduced nano-aperture is directly formed on the surface of said epitaxy substrate with position at front side of the previous nano quantum dot;

(f): Finally, by means of solution rinsing (i.e. wet etching) or gas etching (i.e. dry etching), remove all the nano cylindrical pores on the epitaxy substrate, many active layers of nano quantum dots in same dimension for the LED are fabricated on the epitaxy substrate in high density and even distribution manner.

2. The fabricating method is claimed as the claim 1, wherein, the implementing process of the step (a) in forming said reduced nano-aperture on said top-opening of said nano cylindrical pore comprises sub-steps as below:

(1): Firstly, firmly place said epitaxy substrate on a tilt-rotary console having capability of 3-D tilt with rotation and adjust said tilt-rotary console in tilt angle so that a sealing material of gas molecule or atom state can partially deposit on the end rim of said top-opening of said nano cylindrical pore; and (2): Secondly, let said tilt-rotary console keep in tilt angle inclination, and gradually rotate it one complete rotation, thereby a reduced nano-aperture with diameter being smaller than that of said top-opening is formed on said top-opening of said nano cylindrical pore by deposition of said sealant of gas molecule or atom state.

3. The fabricating method is claimed as the claim 1, wherein, through reiterating the process steps (b) through (e) together with through properly adjusting the tilt angle θ together with a rotation angle Φ parameters, a further certain plurality of desired nano quantum dots are directly formed on the surface of said epitaxy substrate in desired position.

4. The fabricating method is claimed as the claim 1, wherein, said epitaxy substrate in the step (a) is obtained through conventional fabricating processes such as Liquid Phase Epitaxy (LPE), Hydride Vapor Phase Epitaxy (HVPE), Molecular Beam Epitaxy (MBE), or Metal-Organic Vapor Phase Epitaxy (MOVPE).

5. The fabricating method is claimed as the claim 1, wherein, said epitaxy substrate in the step (a) is p-type confining layer of LED or n-type confining layer of LED.

6. The fabricating method is claimed as the claim 1, wherein, a collimator is further installed between said deposit source device and said reduced nano-aperture.

* * * * *